(12) United States Patent
Barabash et al.

(10) Patent No.: US 9,593,414 B2
(45) Date of Patent: Mar. 14, 2017

(54) HYDROGENATED AMORPHOUS SILICON DIELECTRIC FOR SUPERCONDUCTING DEVICES

(71) Applicant: Intermolecular, Inc., San Jose, CA (US)

(72) Inventors: Sergey Barabash, San Jose, CA (US); Chris Kirby, Gambrills, MD (US); Dipankar Pramanik, Saratoga, CA (US); Andrew Steinbach, San Jose, CA (US)

(73) Assignees: Intermolecular, Inc., San Jose, CA (US); Northrop Grumman Systems Corporation, Falls Church, VA (US)

( * ) Notice: Subject to any disclaimer, the term of this patent is extended or adjusted under 35 U.S.C. 154(b) by 209 days.

(21) Appl. No.: 14/145,337

(22) Filed: Dec. 31, 2013

(65) Prior Publication Data

US 2015/0184286 A1    Jul. 2, 2015

(51) Int. Cl.
*H01L 21/00*  (2006.01)
*C23C 16/24*  (2006.01)
(Continued)

(52) U.S. Cl.
CPC .............. *C23C 16/24* (2013.01); *C23C 14/14* (2013.01); *C23C 14/5806* (2013.01); *C23C 14/5826* (2013.01); *C23C 14/5846* (2013.01); *C23C 16/56* (2013.01); *H01J 37/32357* (2013.01); *H01J 37/32917* (2013.01); *H01J 37/32935* (2013.01); *H01J 37/3405* (2013.01)

(58) Field of Classification Search
CPC ............. H01L 31/03762; H01L 31/075; H01L 31/1864; H01L 31/202; G02B 5/0891; H01J 371/32917

USPC .......................................... 438/482; 427/527
See application file for complete search history.

(56) References Cited

U.S. PATENT DOCUMENTS 4,960,675 A * 10/1990 Tsuo et al. ..................... 430/311
5,214,002 A *  5/1993 Hayashi et al. ................. 438/96
(Continued)

FOREIGN PATENT DOCUMENTS

EP    0599730 B1    6/1999
JP    04196601 A    7/1992
(Continued)

OTHER PUBLICATIONS

Pi et al.; Fluorine in Silicon: Diffusion, Trapping, and Precipitation; Apr. 17, 2003; Physical Review Letters, vol. 90, No. 15; The American Physical Society; pp. 155901-1-155901-4.
(Continued)

*Primary Examiner* — Caridad Everhart

(57) ABSTRACT

Amorphous silicon (a-Si) is hydrogenated for use as a dielectric (e.g., an interlayer dielectric) for superconducting electronics. A hydrogenated a-Si layer is formed on a substrate by CVD or sputtering. The hydrogen may be integrated during or after the a-Si deposition. After the layer is formed, it is first annealed in an environment of high hydrogen chemical potential and subsequently annealed in an environment of low hydrogen chemical potential. Optionally, the a-Si (or an H-permeable overlayer, if added) may be capped with a hydrogen barrier before removing the substrate from the environment of low hydrogen chemical potential.

19 Claims, 6 Drawing Sheets

(51) Int. Cl.
*C23C 16/56* (2006.01)
*C23C 14/14* (2006.01)
*C23C 14/58* (2006.01)
*H01J 37/32* (2006.01)
*H01J 37/34* (2006.01)

(56) References Cited

U.S. PATENT DOCUMENTS

| | | | |
|---|---|---|---|
| 5,753,564 A | 5/1998 | Fukada | |
| 2001/0035526 A1* | 11/2001 | Yamazaki et al. | 257/57 |
| 2002/0072157 A1* | 6/2002 | Jinno et al. | 438/158 |
| 2005/0130422 A1* | 6/2005 | Theiss | 438/689 |
| 2010/0003833 A1 | 1/2010 | Tsuji et al. | |
| 2011/0284068 A1* | 11/2011 | Moslehi et al. | 136/256 |

FOREIGN PATENT DOCUMENTS

| | | |
|---|---|---|
| JP | 09069518 A | 3/1997 |
| JP | 10079384 A | 3/1998 |

OTHER PUBLICATIONS

Burin et al.; Universal Dielectric Loss in Glass from Simultaneous Bias and Microwave Fields; Apr. 8, 2013; Physical Review Letters; The American Physical Society; pp. 157002-1-157002-5.

\* cited by examiner

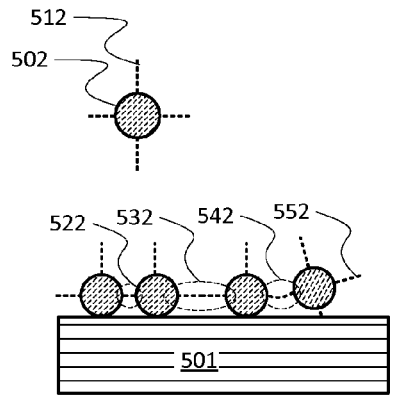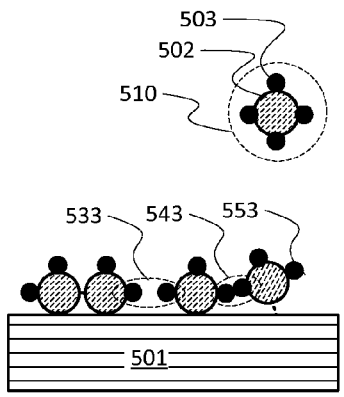
FIG. 5A  FIG. 5B
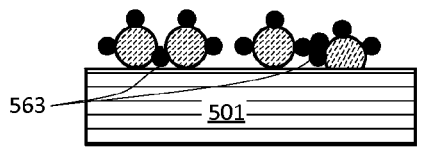
FIG. 5C
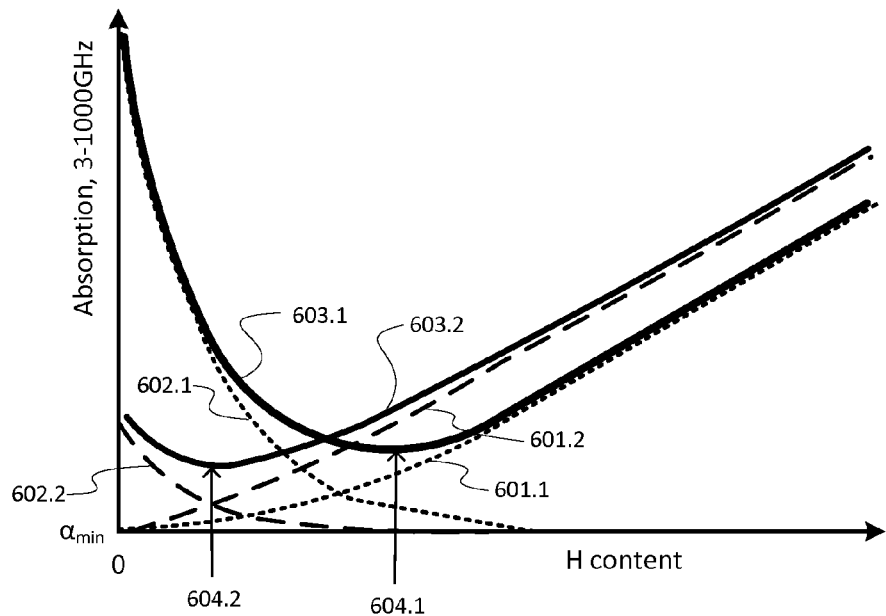
FIG. 6

HYDROGENATED AMORPHOUS SILICON DIELECTRIC FOR SUPERCONDUCTING DEVICES

BACKGROUND

Related fields include thin-film microwave devices with superconducting components and reduction of defects in dielectrics.

At temperatures <100 mK, amorphous silicon (a-Si) is an insulating dielectric. Its low cost and ease of fabrication make it attractive as an interlayer dielectric (ILD) for superconducting interconnects and components for planar microwave devices. However, a-Si can exhibit unwanted absorption at microwave frequencies (e.g., 3-300 GHz) and far-infrared frequencies (300-1000 GHz). This absorption can arise due to irregular structure of the amorphous material, such as from a combination of electronic mid-gap states caused by structural defects, and possibly atomic tunneling states, generally known as two-level systems (TLS). A reduction in this absorption would benefit high-frequency classical devices by reducing signal attenuation, dispersion and jitter. A reduction in this absorption would benefit quantum devices, such as rapid single flux quantum (RFSQ) circuits and reciprocal quantum logic (RQL) by increasing coherence times for quantum state signals.

ILD layers are typically 300-1000 nm thick. At this thickness, many surface treatments are ineffective to remove defects from the bulk of the film. This is also an inconvenient thickness to form by the precisely controlled methods of atomic layer deposition (ALD); each ALD cycle creates a monolayer on the order of 0.1 nm thick, therefore a layer hundreds of nm thick would take too long to be cost-effective.

Hydrogen (H) passivation can reduce absorption from mid-gap states in the a-Si, but H, particularly when weakly bonded, can introduce more absorption due to formation of (TLS. TLS effects originate in electrons, atoms, and other material components that may randomly change quantum states in the presence of an oscillating electric or magnetic field such as the microwave-frequency signals transmitted in superconducting microwave devices.

One type of TLS in silicon-based interlayer dielectrics is a hydrogen atom, usually from a Si precursor ligand, trapped between two dangling bonds from adjacent Si atoms. Because the Si—H bond is weak, the H easily breaks away from one Si atom and bonds to the other, and can just as easily switch back again.

Calculations have predicted that there is an optimal H content in a-Si where loss at 3-1000 GHz is minimized, and where either adding or subtracting H will increase the loss. Therefore, a need exists for methods to optimize the H content in a-Si ILD films for superconducting devices to minimize loss at microwave and far-infrared frequencies.

SUMMARY

The following summary presents some concepts in a simplified form as an introduction to the detailed description that follows. It does not necessarily identify key or critical elements and is not intended to reflect a scope of invention.

Some embodiments of methods for optimizing H content in an a-Si ILD for superconducting electronic devices include forming a hydrogenated Si layer, annealing at a higher temperature in an environment of high H chemical potential, annealing at a lower temperature in an environment of low H chemical potential, and optional capping with a hydrogen barrier to keep additional H from entering or exiting the layer.

A hydrogenated Si layer is formed by depositing a-Si in the presence of H, injecting H into deposited Si, or both. For example, hydrogenated a-Si may be deposited by chemical vapor deposition (CVD) from a precursor that includes H, such as silane, disilane, or trisilane; or a-Si may be deposited by physical vapor deposition (PVD) such as sputtering from a silicon target in the presence of a hydrogen-containing gas such as $H_2$ or $NH_3$. Alternatively, H ions may be implanted in an a-Si layer that may or may not already contain some H.

In some embodiments, the resulting hydrogenated Si layer is first annealed in an environment of high H chemical potential for between 2 seconds and 60 minutes at 450-620 C. To provide the high H chemical potential, a hydrogen source in the chamber may be forming gas ($H_2$—$N_2$ mixture), $H_2$, or $SiH_4$. This first anneal realigns miscoordinated Si atoms and repairs any surface damage (e.g., from ion implantation). The ambient H ensures that enough H is available to passivate remaining defects in the a-Si layer.

In some embodiments, the annealed hydrogenated Si layer is annealed a second time. This second anneal is in an environment with little or no H (e.g., the chamber is purged and kept in vacuum or injected with argon (Ar) or nitrogen ($N_2$)) for 2-60 minutes at 100-450 C. Optionally, the thermal budget may be reduced by ramping the temperature down gradually (~1-10 C/min) during the second anneal. Optionally, other layers may be formed or other processes performed in the environment of low H chemical potential.

In some embodiments, a material with a low diffusion coefficient for H is formed as a hydrogen barrier over the hydrogenated a-Si before removing the substrate from the environment of low H chemical potential. Examples of hydrogen barrier materials include, without limitation, strontium tantalate ("STO", $SrTa_2O_6$) and sub-stoichiometric amorphous aluminum oxide (a-$AlO_x$). In some embodiments, one or more other H-permeable layers (e.g., metals, porous layers, free-surface layers) may be stacked over the hydrogenated a-Si before forming the hydrogen barrier, so that the hydrogen barrier prevents H from entering or leaving the stack.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

FIGS. 5A-5C conceptually illustrate some types of electronic defects in a-Si and H passivation of the defects.

FIG. 6 is an example of modeling results predicting microwave absorption as a function of hydrogen content in an a-Si ILD layer.

DETAILED DESCRIPTION OF EXAMPLE EMBODIMENTS

Figure 1A:
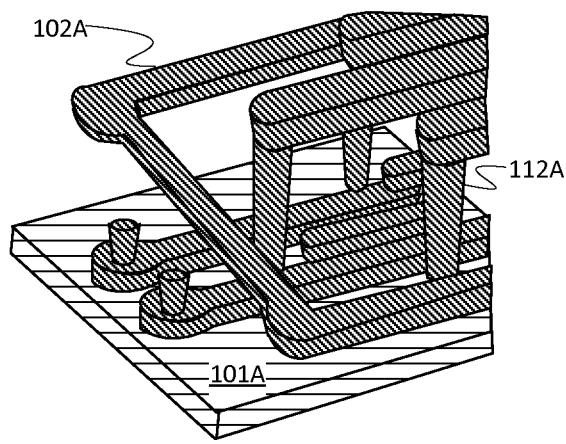
FIGS. 1A and 1B conceptually illustrate interconnects and interlayer dielectrics.

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

Unless the text or context clearly dictates otherwise: (1) by default, singular articles "a," "an," and "the" (or the absence of an article) may encompass plural variations; for example, "a layer" may mean "one or more layers." (2) "Or" in a list of multiple items means that any, all, or any combination of less than all the items in the list may be used in the invention. (3) Where a range of values is provided, each intervening value is encompassed within the invention. (4) "About" or "approximately" contemplates up to 10% variation. "Substantially" (equal, unchanged, or the like)" contemplates up to 5% variation.

"Substrate," as used herein, may mean any workpiece on which formation or treatment of material layers is desired. Substrates may include, without limitation, silicon, germanium, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof. The term "substrate" or "wafer" may be used interchangeably herein. Semiconductor wafer shapes and sizes can vary and include commonly used round wafers of 50 mm, 100 mm, 150 mm, 200 mm, 300 mm, or 450 mm in diameter.

As used herein, a material (e.g. a dielectric material or an electrode material) will be considered to be "amorphous" if it exhibits less than or equal to 20% crystallinity as measured by a technique such as x-ray diffraction (XRD). "Interlayer dielectric," "intermetallization dielectric," "bulk insulator," and "fill dielectric" are used interchangeably herein for an insulating dielectric layer that fills spaces between conducting interconnects (e.g., wiring layers, vias) or between the devices connected by the interconnects.

As used herein, "controlled atmosphere" and "controlled environment" are equivalent and may mean either a vacuum or an inert gas. Vacuum, unless otherwise stated, shall mean a pressure less than about 0.1 Torr. Inert gases include noble gases (helium, neon, argon, krypton, and xenon). Also, unless specifically excluded in the text or context, nitrogen may be used as an inert gas.

Material properties such as "conductor," "superconductor," "semiconductor," "dielectric," and "insulator" may vary with temperature for a given material, and shall be used herein to describe the characteristics of the materials at the intended operating temperature of the device in which the materials are used. For example, "forming a superconducting layer" shall mean "forming a layer of a material expected to exhibit superconductivity at the intended operating temperature of the device being fabricated." "Conformal" shall denote a step coverage of at least 75%.

Figure 1B:
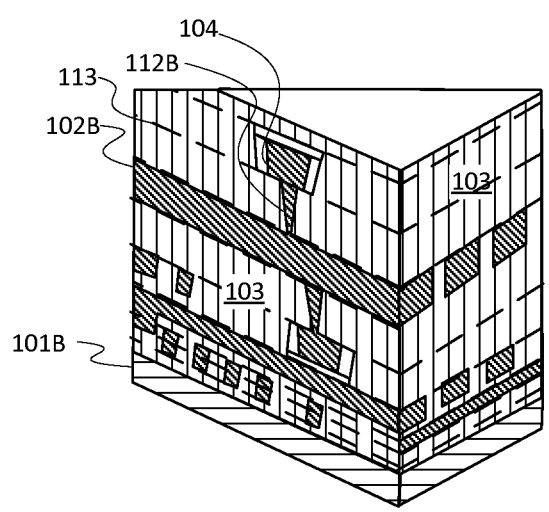

FIGS. 1A and 1B conceptually illustrate interconnects and interlayer dielectrics. FIG. 1A illustrates multiple layers of interconnects without showing the ILD, to better visualize the three-dimensional network of wirings 102A and vias 112A built up on substrate 101A. Substrate 101A may have other layers and structures below those shown. Typically, each wiring 102A begins as a blanket conductive layer formed on an ILD layer. The blanket layer is etched to form the separate conductive paths, and the resulting wiring is buried in another ILD layer. Vias 112A may be constructed similarly to wirings 102A, or alternatively they may be constructed by patterning the ILD; forming openings through the ILD and filling the openings with conductive material. Longer vias that penetrate more than one layer may be constructed as multiple segments, with the length of each segment being the thickness of one layer. Some formations may involve chemical-mechanical polishing (CMP) of either an ILD layer or a conductive layer to expose parts of buried structures. In superconducting microwave devices, the conductive elements (wirings and vias) may be any suitable superconducting material, such as aluminum (Al), niobium (Nb), Nb alloys, Nb nitride, ceramic superconductors, or organic superconductors.

FIG. 1B is a schematic cutaway view of several interconnect and device layers. Here, the ILD 103 is shown between the structures; heavy dotted lines 113 delineate the separately formed layers. The illustrated structures include some wirings 102B and vias 112B, and also some components 104 (e.g., transistors, capacitors, switches, resistors, resonators; in a superconducting device, the components may include Josephson junctions).

Figure 2:
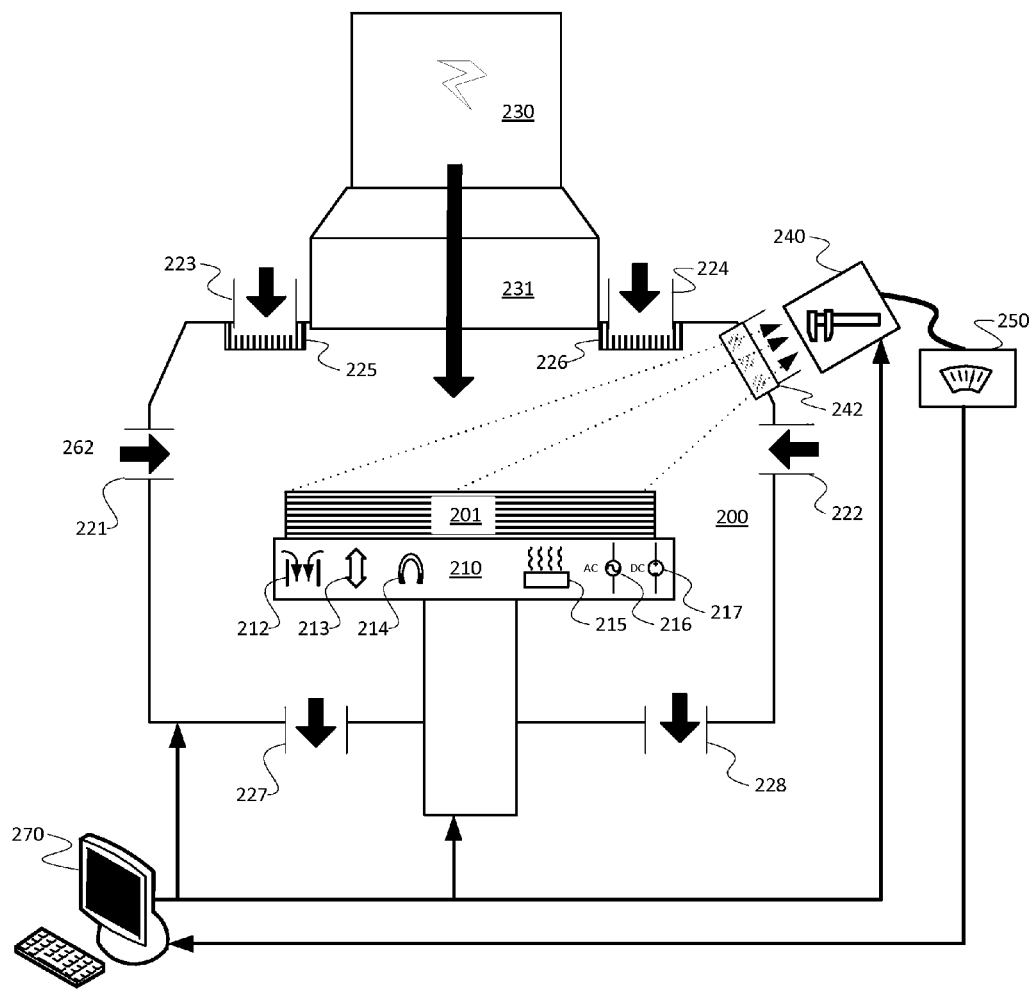
FIG. 2 is a block diagram of an example of a plasma-equipped CVD chamber.

FIG. 2 is a block diagram of an example of a plasma-equipped CVD chamber. Inside CVD chamber 200, substrate 201 is held by a substrate holder 210. Substrate holder 210 may be configured with vacuum 212 (for example, a vacuum chuck to grip the substrate); motion 213 in any direction, which may include tilt and rotation; a magnetic field source 214; heater or temperature control 215; or sources of AC 216 or DC 217 bias voltage. Chamber 200 also has gas inlets 221, 222, 223, 224 for CVD precursors, buffer gases, and purge gases. Exhausts 227, 228 may be coupled to vacuum pumps to remove gases from chamber 200. Some of the inlets may feed through one or more diffusers or "showerheads" 225, 226. In some embodiments, remote plasma chamber 230 may generate reactive species, such as ions, that enter chamber 200 through input adapter 231. In some embodiments, a direct plasma may be generated at or near the surface of substrate 201. Measurement system 240 may monitor substrate 201 through measurement ports 242. The measurements from measurement system 240 may be collected by a monitoring system 250.

Figure 3:
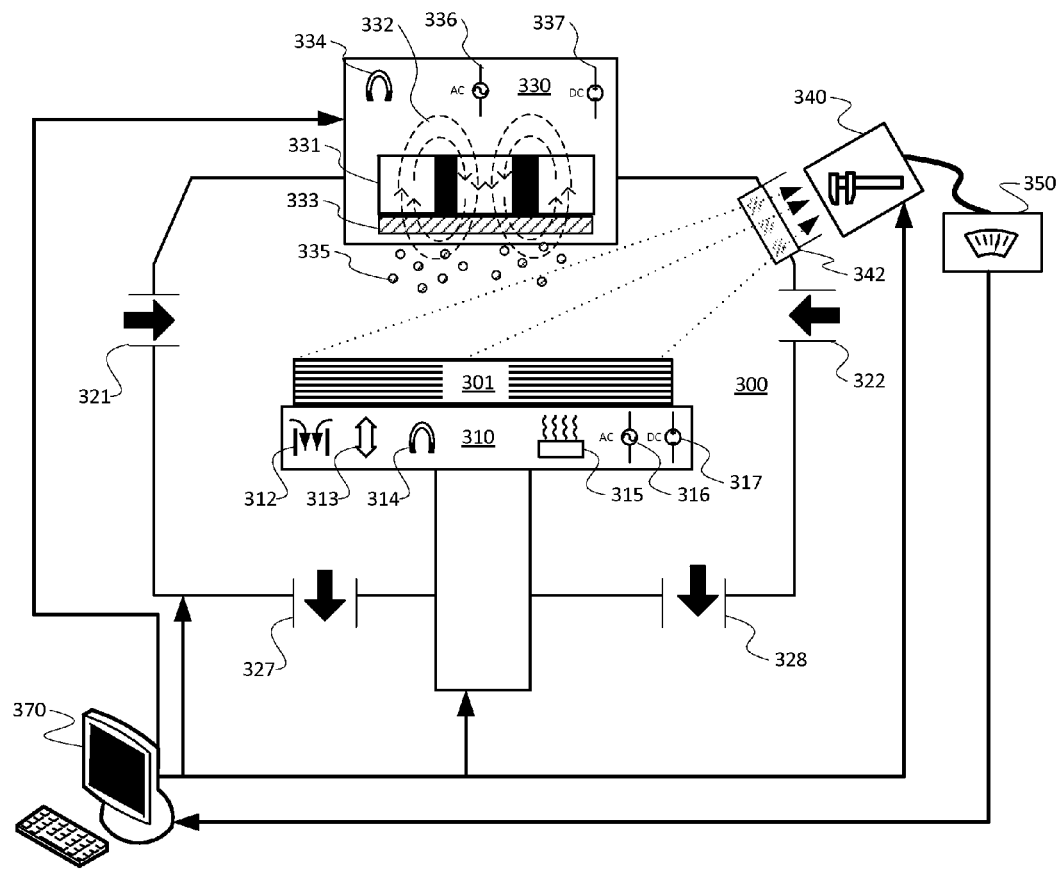
FIG. 3 is a block diagram of an example of a PVD chamber.

FIG. 3 is a block diagram of an example of a PVD chamber. Chamber 300 includes a substrate holder 310 for holding a substrate 301. Substrate holder 310 may include a vacuum chuck 312, translation or rotational motion actuators 313, a magnetic field generator 314, a temperature controller 315, and circuits for applying an AC voltage bias 316 or DC voltage bias 317 to substrate 301. Some chambers include masks (not shown) for exposing only part of substrate 301 to the PVD process. The masks may be movable independent of the substrate. Chamber 300 includes inlets 321, 322 and exhausts 327, 328 for process gases. Process gases for PVD may include inert gases such as nitrogen or argon, and may also include reactive gases such as hydrogen or oxygen.

Chamber 300 includes least one sputter gun 330 for sputtering elementary particles 335 (such as atoms or molecules) from a sputter target 333 by means of plasma excitation from the electromagnetic field generated by magnetron 331. Sputter gun 330 may include adjustments for magnetic field 334, AC electric field 336, or DC electric field 337. Some sputter guns 330 are equipped with mechanical shutters (not shown) to quickly start or stop the exposure of substrate 301 to elementary particles 335. Some PVD chambers have multiple sputter guns.

Some chambers 300 support measuring equipment 340 that can measure characteristics of the substrate 301 being processed through measurement ports 342. Results for measuring equipment 340 may be monitored by monitoring equipment 350 throughout the process, and the data sent to a controller 370, such as a computer. Controller 370 may also control functions of substrate holder 310, chamber 300 and its gas inlets and outlets 321, 322, 327, and 328, sputter gun 330, and measurement equipment 340.

Figure 4:
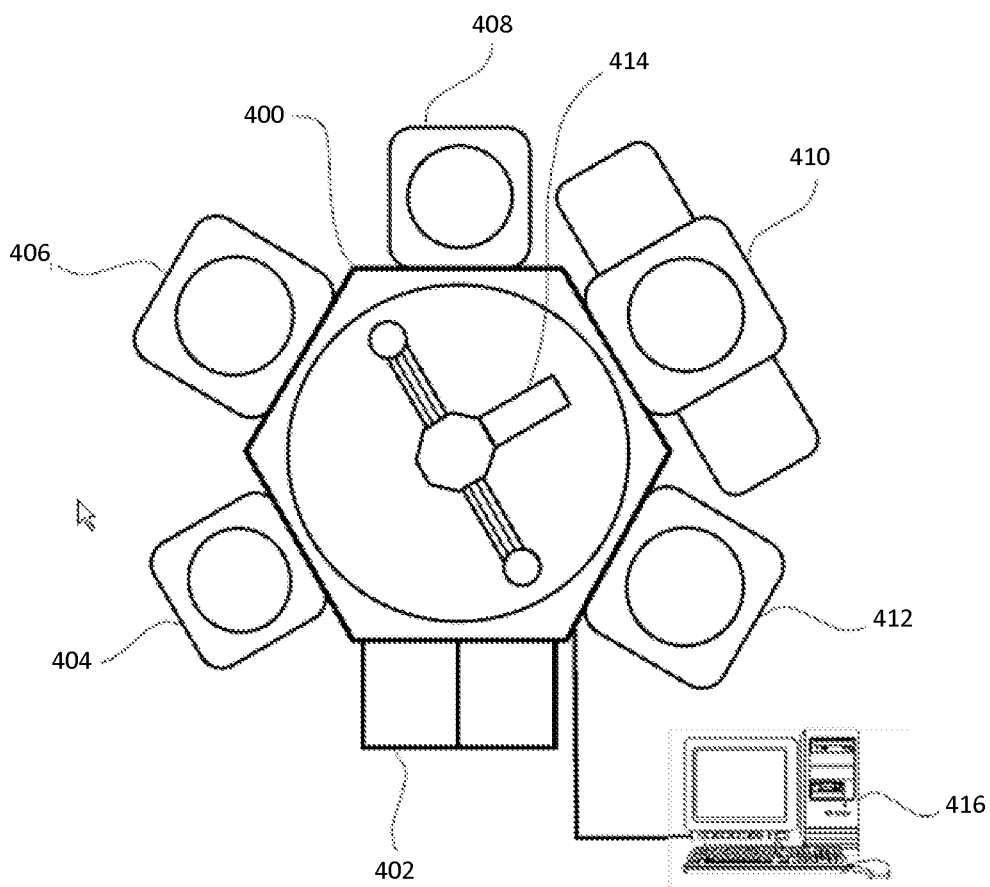
FIG. 4 is an example block diagram of a multi-chamber processing system with a shared controlled environment.

FIG. 4 is an example block diagram of a multi-chamber processing system with a shared controlled environment. A frame 400 supports multiple processing modules. Frame 400 may be a unitary frame enclosing a controlled environment. Within the controlled environment, substrates may be transferred between modules within the frame without exposure to ambient air or any other uncontrolled or unwanted ambient. Load lock/factory interface 402 provides access into the plurality of modules. Robot 414 provides for the movement of substrates (and masks) between the modules and into and out of load lock 402. Modules 404-412 may be any set of modules. For example, module 404 may be an orientation/degassing module, module 406 may be a PVD module, module 408 may be a CVD module with or without plasma capability for ion implantation, and modules 410 and 412 may be annealing modules. One or more of the modules 404-412 may be capable of heating the substrate. In some embodiments, a centralized controller, i.e., computing device 416, may control the processes, including the power supplies, substrate handling, plasma generating sources, liquid or gas inlets and exhausts, temperature controllers, and the like. This system is a non-limiting example of a system that can alternate, for example, PVD and plasma treatments or PVD and ALD or CVD depositions without exposing the substrate to uncontrolled ambient conditions.

FIGS. 5A-5C conceptually illustrate some types of electronic defects in a-Si and H passivation of the defects. These illustrations are only intended to explain some broad concepts and may not accurately represent the structure of a particular material.

In FIG. 5A, the Si atom 502 has 4 valencies (available bonding sites) 512. Those skilled in the art will recognize that in three dimensions, the bonds are typically represented as 120° apart, equally spaced on a sphere, forming the vertices of a tetrahedron. However, because some of the concepts being explained here are more easily visualized in 2D, these valencies are symbolically represented as equally spaced on a circle rather than a sphere; that is, 90° apart, forming the vertices of a square.

If initially unbonded or partially-bonded Si atoms are deposited in an amorphous arrangement on substrate 501, their spacings and orientations will be largely random. Pairs of Si atoms may form strong bonds 522 if they are close together and their valencies are well aligned. Pairs of Si atoms may form weak bonds 532 if they are too far apart to form a strong bond 532, but still close enough and with sufficiently well-aligned valencies to form a bond. Pairs of Si atoms may form strained bonds 542 if they are close enough to bond, but their valencies are misaligned and are not free to self-align (e.g., the atoms are held in that misaligned orientation by other forces, such as strong bonds to other Si atoms or to atoms in substrate 501). Both weak bonds and strained bonds give rise to loss-inducing gap states in the material. If no other Si atom is close enough to form any kind of bond, the Si atom may have a dangling bond 552. Weak bonds, strained bonds, and dangling bonds can all cause dielectric loss in superconducting microwave devices.

Miscoordination is another type of electronic defect. If the Si atom has fewer or more nearest neighbors than it has valencies (e.g., it has 4 valencies but 3 or 5 nearest neighbors), the valencies may be shifted out of their lowest-energy spacing or orientation. For example In the case of 3 nearest neighbors, one of the atom's available electrons may be unpaired. In the case of 5 nearest neighbors, one (or more) of the available electrons may be weakly paired to more than one neighbor. Moreover, a properly coordinated 3D Si atom has 120° angles between its valencies, but a miscoordinated Si atom may have two of them forced to a narrower angle, such as 90°. Absent severe damage to the material, miscoordinations are easily repaired by annealing; the heat provides sufficient energy for the Si atoms to rearrange themselves into the minimal-energy 4-coordinated tetrahedrally bonded state.

In FIG. 5B, the a-Si has enough H atoms 503 to passivate all the electronic defects (weak bonds, strained bonds, and dangling bonds). Each dangling bond 552 is replaced by a single bonded H atom 553. The weak bond 532, which otherwise may be more likely to persist after annealing than dangling bond 552 or strained bond 542, is replaced by a pair of H atoms 533, one bound to each Si atom. The formation energy can depend on specific atomic arrangement but can be about −0.7 eV per H atom, so the reaction can readily occur if H is available. For example, if silane 510 is the Si precursor for CVD, 4 H atoms come into the chamber as ligands for each Si atoms, and some may remain attached to their original Si atom or satisfy a dangling or weak bond elsewhere in the deposited layer. The strained bond 542 is replaced by a pair of H atoms 543, one bound to each Si atom. The formation energy can depend on specific atomic arrangement but can be nearly zero or even positive, e.g. about +0.15 eV per H atom, so extra energy may be needed to force the reaction; for example, from impacts (as in ion implantation) or heat (as in annealing). The formation energy of configuration 543 can still be smaller than the formation energy of an interstitially trapped hydrogen, thus this configuration can be metastable once formed. For both weak bonds and strained bonds, the gap states may only be eliminated if both of the participating Si valencies are bonded to H atoms. With the defects passivated, the loss is reduced.

In FIG. 5C, the a-Si has some excess H atoms 563. These H atoms 563 are not bonded to anything. Instead, they are trapped in interstices; they may be attracted to a nearby Si atom but do not form a true bond. Interstitial H atoms 563 are free to tunnel through the layer, creating TLS, which increases the dielectric loss even though all the electronic defects are passivated. The tunneling probability of a TLS varies as $e^{-\lambda}$, where $$\lambda = d\sqrt{\frac{2\,\mathrm{mV}}{\hbar}},$$

where d is the tunneling distance, m is the mass of the tunneling particle, V is the particle's potential energy relative to a convenient reference level, and $\hbar$ is Planck's constant. Therefore, for a given distance and a given potential energy, tunneling is more probable for a particle of smaller mass, and H has the smallest mass of all the chemical elements.

Thus, an a-Si ILD may be expected to have its lowest loss at an optimal hydrogenation level, where all the defects are passivated but extra TLS are not formed.

FIG. 6 is an example of modeling results predicting microwave absorption as a function of hydrogen content in an a-Si ILD layer. The model accounts for the availability of different sites at which H in a-Si can reside, including the interstitial and the defect-passivating sites, as well as for the difference in the number of such sites and of H energies at each site. The model neglects the interaction between different H atoms except when passivating the same defects. Thus the model calculates H tunneling and H passivation of Si defects independently, and then treats them as roughly additive.

The absorption contribution of H tunneling (curves 601.1 and 601.2) increases linearly with the amount of interstitial H. After the available defects are passivated, any more H added to the layer is interstitial and able to tunnel; at this point, the curve becomes a straight line with a steady-state slope. Curve 601.1 represents the tunneling contribution as H is added to an a-Si layer with a relatively large number of structural defects (e.g., a pseudo-Boltzmann distribution of defects with an effective temperature of 2000K). Initially most or all of the added H is taken up to passivate the defects rather than becoming interstitial H, so curve 601.2 begins at nearly zero slope and gradually increases to a steady-state slope as the defects are saturated. By contrast, line 601.2 represents the tunneling contribution as H is added to an a-Si layer with a relatively small number of structural defects (e.g., a distribution of defects annealed at 400K). Because the number of defects is small, they are quickly passivated by a small amount of H and any additional H can only lodge in the interstices. Therefore curve 601.1 reaches its steady-state slope very quickly, after only a little H is added.

Meanwhile, the absorption contribution of Si defects (lines 602.1 and 602.2) decreases rapidly at first, and then more slowly, as H is added. These curves reflect the probability of defect sites remaining unpassivated despite the presence of available H. Curve 602.1, for the a-Si layer with the large number of structural defects, begins at a high value, drops off rapidly as H is added, and flattens about halfway down the x-axis when the defects are saturated. Curve 602.2, for the a-Si layer with the relatively small number of structural defects, begins at a lower value and flattens sooner than curve 602.1, but its initial slope is shallower ( ).

Curve 603.1 is the sum of curves 601 and 602.1, representing the cumulative microwave absorption effects of both tunneling and defects in the a-Si layer with the large number of structural defects. Curve 603.1 has a minimum at point 604.1, representing the H content that produces the least absorption for that layer; either less H or more H cause higher absorption. Similarly, Curve 603.2 is the sum of curves 601 and 602.2, representing the cumulative microwave absorption effects of both tunneling and defects in the a-Si layer with the small number of structural defects. Curve 603.2 has a minimum at point 604.2, representing the H content that produces the least absorption; both less H and more H result in higher absorption.

Note that the two minima 604.1 and 604.2 occur at different values of H content. This indicates that there is no universal optimum H content applicable to all types of a-Si layers. Instead, the optimum but depends on the prevalence of structural defects, which is likely to vary even if the layer formation conditions are carefully controlled.

Annealing has been observed to reduce miscoordinations in a-Si even without passivants. Weak bonds that give rise to gap states, however, are promoted by entropy at all but the lowest temperatures and often persist after annealing. Passivants such as H can effectively replace those weak bonds to eliminate the accompanying gap states, especially with energetically-preferred double bonds to defect sites. Some embodiments of methods to optimize H content in a-Si layers combine passivation and annealing in a manner calculated to correct miscoordinations and passivate weak, strained, or dangling bonds without creating excess TLS.

Figure 7:
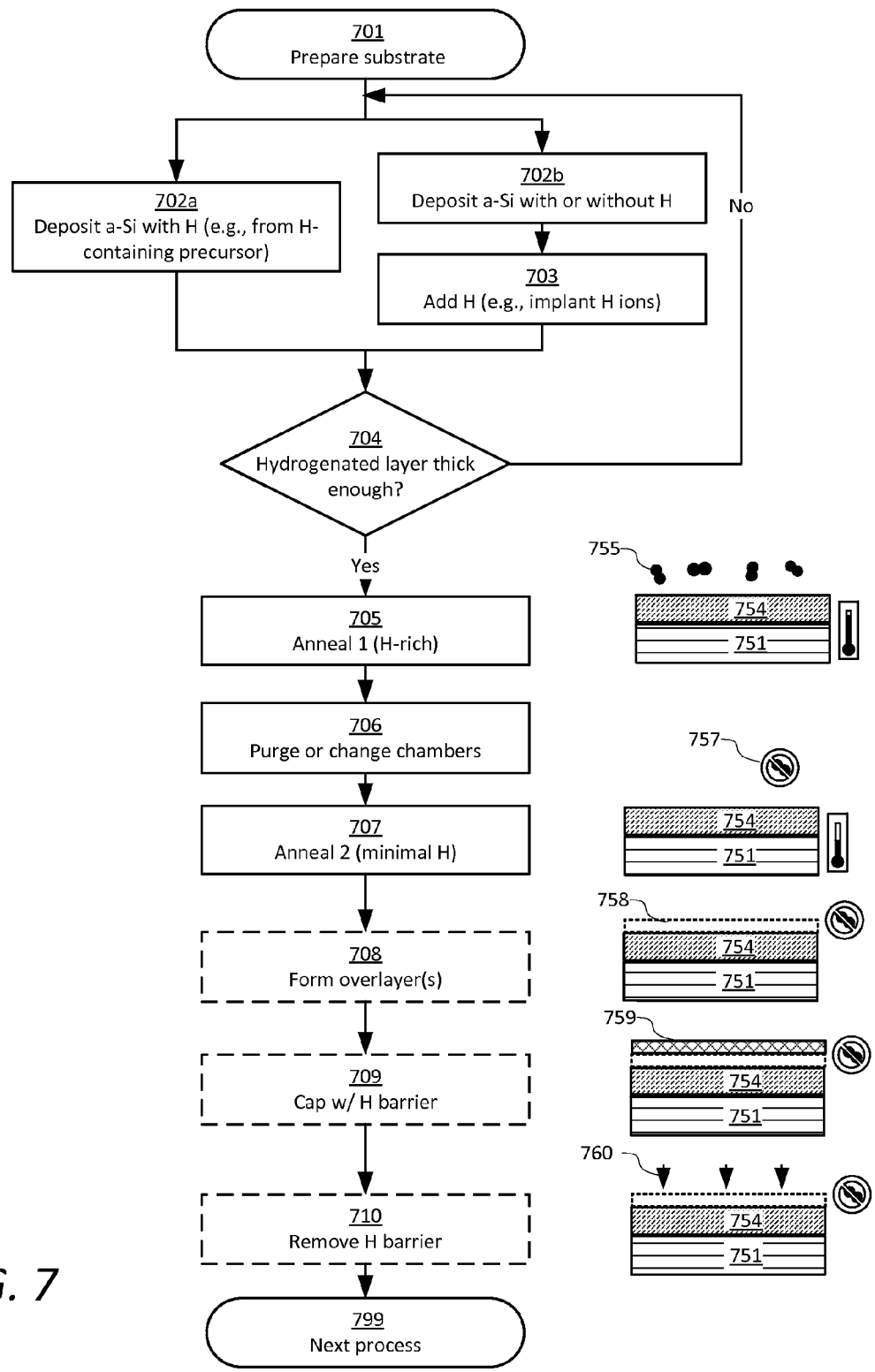
FIG. 7 is a process flowchart for producing an optimally hydrogenated a-Si ILD layer according to some embodiments.

FIG. 7 is a process flowchart for producing an optimally hydrogenated a-Si ILD layer according to some embodiments. Step 701 of preparing a substrate may include a pre-clean, or the patterning or other partial removal of an underlying layer. Substrate preparation 701 may be followed by either step 702A of hydrogenating the a-Si during deposition, or by a sequence of step 702b of depositing the a-Si (with or without some H) and step 703 of adding H to the deposited layer.

For example, the a-Si may be deposited by CVD, at least in part from an H-containing precursor such as silane, disilane, or trisilane for either step 702a or step 702b. Alternatively, hydrogenated a-Si may be deposited in step 702a or step 702b by sputtering from a silicon target in the presence of a hydrogen-containing gas such as $H_2$ or silane. In some embodiments of step 702b, the a-Si layer is partially hydrogenated or non-hydrogenated when initially deposited (e.g., by CVD from a non-H-containing precursor or a mixture of H-containing and non-H-containing precursors, or by sputtering from a silicon target in a vacuum or inert-gas environment). CVD may be performed in a chamber such as the one illustrated in FIG. 2. PVD may be performed in a chamber such as the one illustrated in FIG. 3.

In another example, H may be added after forming a partially hydrogenated or non-hydrogenated a-Si layer by implantation of H ions in step 703. Ion implantation may be performed in a plasma-equipped chamber such as the one illustrated in FIG. 2, or in a dedicated plasma treatment chamber. In some embodiments, some H may be added to the a-Si during deposition and some may be added after deposition. Either type of deposition sequence may be repeated until a desired thickness of the hydrogenated layer 754 on substrate 751 is reached at step 704. For example, for an ILD the desired thickness may be 300-1000 nm, but these techniques may also be used to deposit tunnel barriers (~0.5-3 nm) or gate dielectrics (5-30 nm).

The deposition 702a or (702b+703) is followed by step 705 of annealing in an environment of high H chemical potential. The energy put into the layer by the heat of this first anneal enables the Si atoms in layer 654 to rearrange themselves to correct miscoordinations. At the same time, the conditions provide an abundance of H to passivate weak, strained, or dangling bonds that remain inside the a-Si layer. To provide the high H chemical potential, a hydrogen source 755 in the chamber may include forming gas ($H_1$—$N_2$ mixture), $H_2$, or $SiH_4$. The pressure in the chamber may exceed 1 atm, such as 1-2 atm. The substrate 751 may be heated to between about 450 C and 620 C for between about 2 seconds and 60 minutes. In some embodiments, objects of this first anneal may include saturating defects susceptible to H-passivation while promoting correct coordination of Si—Si bonds in a-Si layer 754. If ion damage is present (e.g., from implanting H), another object of this first anneal may be to repair the damage.

The high H chemical potential annealing 705 is followed by step 706 of purging the chamber to remove H-containing gases or, alternatively, moving the substrate within a multi-chamber tool such as the example of FIG. 4 to a chamber without H-containing gases. Any other known method of situating the substrate in an environment of low H chemical potential (e.g., partial pressure of all H-containing gases, particularly $H_2$ and water vapor, <0.1 Torr, such as <0.001 Torr) may be used.

In step 707, the substrate 751 with hydrogenated a-Si layer 754 is annealed again in an environment of low H chemical potential 757. This second anneal may be in a vacuum or low-pressure (<10 Torr) inert gas environment, at a temperature between about 100 C and 450 C, for between about 2 minutes and 60 minutes. Alternatively, up to 1 atm of Ar may be in the chamber, as long as the partial pressure of H-containing gases is below about 0.1 Torr. In some embodiments, the temperature of second anneal 707 may be lower than that of first anneal 705. Optionally, the temperature may be ramped down (e.g., 1-10 C/min) during the second anneal to conserve thermal budget. An object of this second anneal may include freeing interstitial H to either find a remaining defect to passivate or to leave the layer altogether (e.g., as recombined $H_2$). Optionally, low H chemical potential annealing may include one or more purges to remove the hydrogen outgassing from the a-Si layer.

Some embodiments may include step 708 of forming one or more overlayers. Substrate 751 may be kept in the environment of low H chemical potential while forming one or more H-permeable overlayers 758 over hydrogenated a-Si layer 754. Examples of H-permeable overlayers may include, without limitation, porous layers, free-surface layers, or metal layers such as superconducting metals Nb, Al or their alloys that are used in interconnects or electrodes.

Some embodiments may include step 709 of capping the substrate with a hydrogen diffusion barrier layer 759. Examples of materials for the hydrogen diffusion barrier layer may include, without limitation, ($SrTa_2O_6$) and sub-stoichiometric amorphous aluminum oxide (a-$AlO_x$). Diffusion barrier layer 759 may be formed directly over hydrogenated a-Si layer 754 or over overlayer 758 if they are present.

Some embodiments may include step 710 of removing hydrogen diffusion barrier layer 759 before next process 799. For example, hydrogen diffusion barrier layer 759 may be a temporary or sacrificial layer. Because excess H still needs to be excluded from hydrogenated a-Si layer 754 to avoid forming TLS, removal agent 760 (e.g., an etchant) may be substantially free of H sources such as $H_2O$, HCl, or HF (e.g., a weight percentage of all H-containing chemicals in the etchant is less than 0.01%).

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A method, comprising:
   forming a first layer on a substrate, wherein the first layer comprises hydrogenated amorphous silicon;
   performing a first anneal of the first layer in an environment of high hydrogen chemical potential;
   after the first anneal, performing a second anneal of the first layer in an environment of low hydrogen chemical potential, and
   after the second anneal, forming a second layer over the first layer, wherein the second layer is operable as a hydrogen barrier.

2. The method of claim 1, wherein a substrate temperature during the second anneal is lower than a substrate temperature during the first anneal.

3. The method of claim 1, wherein a substrate temperature during the first anneal is between about 450 C and about 620 C.

4. The method of claim 1, wherein a substrate temperature during the second anneal is between about 100 C and about 450 C.

5. The method of claim 1, wherein a substrate temperature decreases during the second anneal.

6. The method of claim 1, wherein a microwave-frequency absorption of the first layer is lower after the second anneal than before the first anneal.

7. The method of claim 1, wherein a number of miscoordinated silicon atoms in the first layer is lower after the second anneal than before the first anneal.

8. The method of claim 1, wherein a hydrogen content of the first layer is higher after the first anneal than before the first anneal.

9. The method of claim 1, wherein a hydrogen content of the first layer is lower after the second anneal than before the second anneal.

10. The method of claim 1, wherein the forming of the first layer comprises implantation of hydrogen ions.

11. The method of claim 1, wherein the environment of high hydrogen chemical potential comprises at least one of forming gas, hydrogen gas, or silane.

12. The method of claim 1, wherein the environment of high hydrogen chemical potential comprises a chamber pressure between about 1 atm and 2 atm.

13. The method of claim 1, wherein the second layer comprises SrTa2O6 or sub-stoichiometric amorphous aluminum oxide.

14. The method of claim 1, further comprising forming an overlying layer over the first layer before the forming of the second layer.

15. The method of claim 1, further comprising removing the second layer using a substantially hydrogen-free etchant.

16. The method of claim 1, wherein the forming of the first layer comprises chemical vapor deposition from a hydrogen-containing precursor.

17. The method of claim 16, wherein the hydrogen-containing precursor comprises silane, disilane, or trisilane.

18. The method of claim 1, wherein the forming of the first layer comprises sputtering from a silicon target.

19. The method of claim 18, wherein the silicon target is sputtered in the presence of a hydrogen-containing gas.

* * * * *